(12) United States Patent
Chiang

(10) Patent No.: US 7,321,266 B2
(45) Date of Patent: Jan. 22, 2008

(54) CURRENT-MATCHING VARIABLE GAIN AMPLIFIER

(75) Inventor: Ming-Chou Chiang, Taipei County (TW)

(73) Assignee: Integrated System Solution Corp., Hsinchu (TW)

( * ) Notice: Subject to any disclaimer, the term of this patent is extended or adjusted under 35 U.S.C. 154(b) by 241 days.

(21) Appl. No.: 10/908,553

(22) Filed: May 17, 2005

(65) Prior Publication Data

US 2006/0261893 A1  Nov. 23, 2006

(51) Int. Cl.
H03F 3/45 (2006.01)
(52) U.S. Cl. ..................................... 330/254
(58) Field of Classification Search ............... None
See application file for complete search history.

(56) References Cited

U.S. PATENT DOCUMENTS

| | | | | |
|---|---|---|---|---|
| 5,661,437 A * | 8/1997 | Nishikawa et al. | ......... | 330/282 |
| 6,104,246 A * | 8/2000 | LaFerrara et al. | .......... | 330/282 |
| 6,127,886 A * | 10/2000 | Khabbaz et al. | .............. | 330/51 |
| 6,211,737 B1 | 4/2001 | Fong | ......................... | 330/282 |
| 6,292,032 B1 * | 9/2001 | Hirabayashi et al. | ......... | 327/67 |
| 6,400,227 B1 | 6/2002 | Goldfarb et al. | ............ | 330/295 |
| 6,583,668 B1 | 6/2003 | Liu et al. | .................... | 330/254 |
| 6,586,993 B2 * | 7/2003 | Macedo | ........................ | 330/51 |
| 6,724,257 B2 * | 4/2004 | Wrathall | ..................... | 330/253 |
| 6,731,171 B2 * | 5/2004 | Yamashita | ................... | 330/285 |
| 6,737,841 B2 * | 5/2004 | Wrathall | ..................... | 323/282 |
| 6,753,730 B2 * | 6/2004 | Yamamoto | .................. | 330/253 |
| 6,977,552 B2 * | 12/2005 | Macedo | ....................... | 330/283 |
| 7,120,411 B2 * | 10/2006 | Darabi | .................... | 455/240.1 |
| 7,126,427 B2 * | 10/2006 | Aoki | .......................... | 330/311 |
| 2003/0181181 A1 | 9/2003 | Darabi | .................... | 455/250.1 |
| 2006/0119435 A1 * | 6/2006 | Oh et al. | .................... | 330/311 |

* cited by examiner

*Primary Examiner*—Robert Pascal
*Assistant Examiner*—Krista M Flanagan
(74) *Attorney, Agent, or Firm*—Jianq Chyun IP Office

(57) ABSTRACT

A current-matching variable gain amplifier is provided. The amplifier comprises a reference current source, at least one cascode amplifier, a matching circuit, a control circuit, and at least one first blocking circuit. The reference current source provides a reference current. Each of the cascode amplifiers amplifies an input signal according to the reference current. The matching circuit equalizes the voltage level at a first node in each cascode amplifier and the voltage level at a second node in the matching circuit. The matching circuit also equalizes the current of a main MOSFET of each cascode amplifier and the current of a first MOSFET of the matching circuit. The control circuit controls the current of the first MOSFET of the matching circuit. Each of the first blocking circuit(s) corresponds with the cascode amplifier, and is coupled between the reference current source and the corresponding cascode amplifier, for blocking RF signals.

15 Claims, 6 Drawing Sheets

CURRENT-MATCHING VARIABLE GAIN AMPLIFIER

BACKGROUND OF THE INVENTION

1. Field of the Invention

This invention generally relates to a variable gain amplifier, and especially to a current-matching variable gain amplifier.

2. Description of Related Art

Following the rapid development in radio communication field, a lot of people have been engaged in the research of variable gain amplifier. Up to now, though many solutions have been introduced, there is still room for improvement.

FIG. 1 is a schematic circuit drawing of a variable gain amplifier according to an U.S. patent No. 2003/0181181. Wherein, Input is an input terminal, Output is an output terminal, and Inductor 202 is a load of the amplifier circuit. The amplifier utilizes a control signal 201 to turn on or turn off n-channel metal oxide semiconductor field effect transistor (i.e. NMOSFET, as NMOS transistor hereinafter) 211 and 212, for changing a current passing through the inductor 202, and switching between two gains. At a high gain mode, the control signal 201 would turn off the NMOS transistor 211 and turn on the NMOS transistor 212, such that the total current pass through the inductor 202, to achieve a high gain. At a low gain mode, the control signal 201 turns on the NMOS transistor 211 and turns off the NMOS transistor 212, such that a part of the current passes through the inductor 202, to achieve a low gain. The amplifier circuit is simpler than the previous amplifier. But the problem is, in order to achieve an accurate gain value, the sizes of the NMOS transistors 211 and 213 must be appropriately matched, and this problem is not easy to solve in the limitation of the transistor manufacturing process. In order to make the most of the current pass through the NMOS transistor 211 for achieving the low gain mode, the transistor size must be bigger, so that the power wastage at the high gain mode is higher and the noise characteristic is worse.

FIG. 2 is a schematic circuit drawing of a variable gain amplifier according to U.S. Pat. No. 6211737. Wherein, Input is an input terminal of the amplifier, and Output is an output terminal of the amplifier. Like the previous amplifier, this one utilizes a bypass method. That is, the amplifier utilizes the control signals 301 to 303 separately to turn on or turn off bipolar junction transistors (BJT transistor hereinafter) 311 to 313, so that branch circuits 321 to 323 either share or not share the current, for changing the current value passing through BJT transistor 310 and switching among different gains. The amplifier and the above mentioned amplifier has the same disadvantage. That is, the size of the transistors cannot be matched easily and the power wastage at high gain mode is higher.

Accordingly, a better and simply designed circuit is desired for further improving the technical problems in the prior art.

SUMMARY OF THE INVENTION

An object of the present invention is to provide a current-matching variable gain amplifier, which has simpler circuit, does not require complex impedance match, has lower power wastage at high gain mode, and is a solution to conventional technical problems.

In order to achieve the above mentioned and other objects, the present invention provides a current-matching variable gain amplifier, comprising a reference current source, at least a cascode amplifier, a matching circuit, a control circuit, and at least a first blocking circuit. Wherein, the reference current source provides a reference current. The cascode amplifiers separately receive an input signal and further output an output signal according to the reference current. The matching circuit is coupled to the above-mentioned cascode amplifiers, so that the voltage at the first nodes of every cascode amplifiers is equal to the voltage at the second node of the matching circuit, and that the current of the NMOS transistors of the every cascode amplifiers is equal to the current of the first NMOS transistor of the matching circuit. The control circuit is coupled to the matching circuit, for controlling the current of the first NMOS transistor of the matching circuit. Each of the first blocking circuit(s) corresponds with the above-mentioned cascode amplifier, and is coupled between the reference current source and the corresponding cascode amplifier, for blocking radio frequency signals.

In accordance with the current-matching variable gain amplifier described in the embodiments of the present invention, the current-matching variable gain amplifier comprises only one cascode amplifier which constitute a single-sided cascode amplifier.

In accordance with the current-matching variable gain amplifier described in the embodiments of the present invention, the current-matching variable gain amplifier comprises two cascode amplifiers connected in parallel. The cascode amplifiers constitute a differential cascode amplifier. The output terminal of the differential cascode amplifier is a set of the output terminals of two cascode amplifiers, and the input terminal of the differential cascode amplifier is a set of the input terminals of two cascode amplifiers.

In accordance with the current-matching variable gain amplifier described in the embodiments of the present invention, the sizes of the main MOS transistors of the cascode amplifiers are the same as the size of the first MOS transistor of the matching circuit.

In accordance with the current-matching variable gain amplifier described in the embodiments of the present invention, the matching circuit further comprises a switch device, a first MOS transistor, an operational amplifier, at least a second MOS transistor, and at least a second blocking circuit. Wherein, the switch device is coupled to a voltage source. The first MOS transistor, which is diode-connected, is coupled between the switch device and the above-mentioned second node. An input terminal of the operational amplifier is coupled to the second node. Each of the second MOS transistor(s) corresponds with the cascode amplifier, and is coupled among the voltage source, the output terminal of the operational amplifier and the first node of the corresponding cascode amplifier. Each of the second blocking circuit(s) corresponds with the cascode amplifier, and is coupled between another input terminal of the operational amplifier and the first node of the corresponding cascode amplifier, for blocking radio frequency signals.

In accordance with the current-matching variable gain amplifier described in the embodiments of the present invention, the control circuit further comprises at least a third MOS transistor. The third MOS transistors are separately coupled among the matching circuit, the reference current source and a ground, and constitute a current mirror with the reference current source. If the control circuit comprises more than one third MOS transistor, the control circuit further comprises multiple switch devices. Each of the switch devices corresponds with one of the third MOS transistors, and is coupled between the matching circuit and the corresponding third MOS transistor.

In accordance with the current-matching variable gain amplifier described in the embodiments of the present invention, the control circuit further comprises a variable current source and an output sensor. The variable current source is coupled to the matching circuit. The output sensor is coupled between the variable current source and the output terminals of the cascode amplifiers, and adjusts the output current of the variable current source according to the output voltages of the cascode amplifiers.

In accordance with the current-matching variable gain amplifier described in the embodiments of the present invention, each of the cascode amplifiers further comprises an inductor, a fourth MOS transistor, a main MOS transistor and a load circuit. The inductor is coupled to a ground. The fourth MOS transistor is coupled among the inductor, the input terminal of the cascode amplifier and the first node, to receive the input signal. The main MOS transistor is coupled among the first node, a voltage source and the output terminal of the cascode amplifier. The load circuit is coupled between the voltage source and the output terminal of the cascode amplifier, to receive the current from the voltage source.

In accordance with the current-matching variable gain amplifier described in the embodiments of the present invention, the load circuit comprises at least a load device, and the types of the load devices are one of capacitor, inductor and resistor.

In accordance with the current-matching variable gain amplifier described in the embodiments of the present invention, at least a secondary MOS transistor is included. The secondary MOS transistors are parallel connected to the main MOS transistor, and are separately turned on or turned off according to a corresponding control signal.

In accordance with the following embodiments of the present invention, the present invention utilizes the feedback control mechanism using the operational amplifier as the center, such that the current of the first MOS transistor is the same as the current of the main MOS transistor, and therefore the circuit can be simpler and a complicated impedance match is not required. Further, since the size of the second MOS transistor is smaller, the power wastage at the high gain mode is lower, so it is a solution to conventional technical problems.

The above and other features of the present invention will be better understood from the following detailed description of the embodiments of the invention that is provided in communication with the accompanying drawings.

DESCRIPTION OF THE EMBODIMENTS

Figure 1:
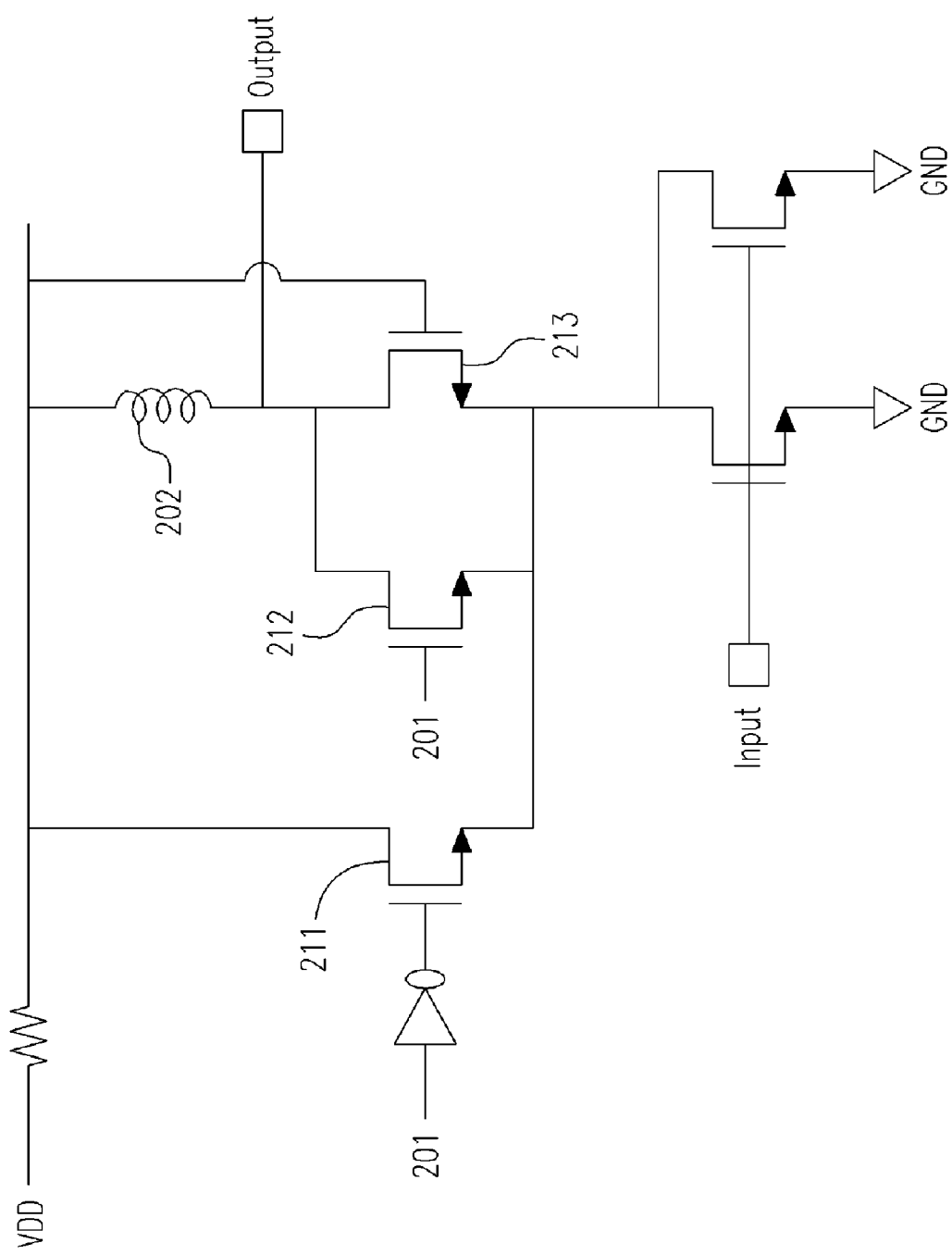
FIG. 1 and FIG. 2 are schematic drawings of conventional variable gain amplifiers.
Figure 2:
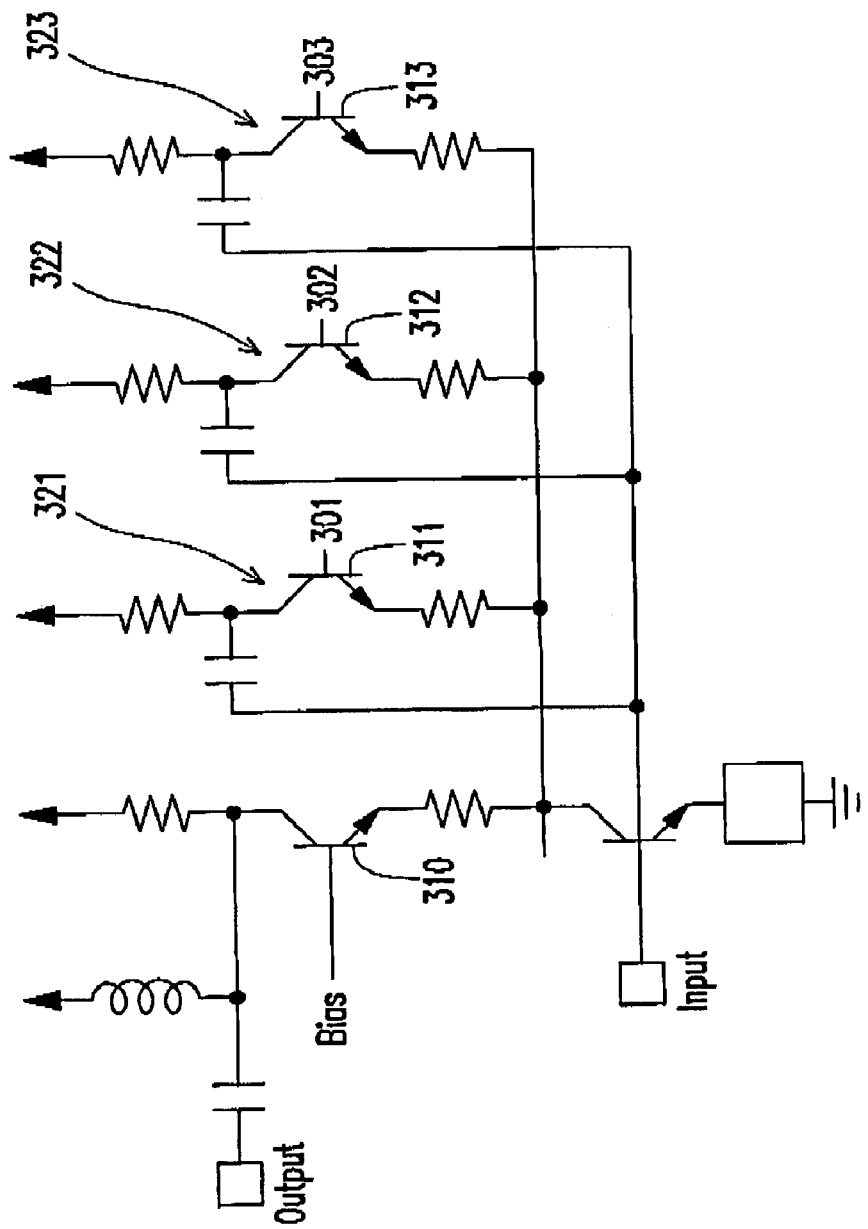
Figure 3:
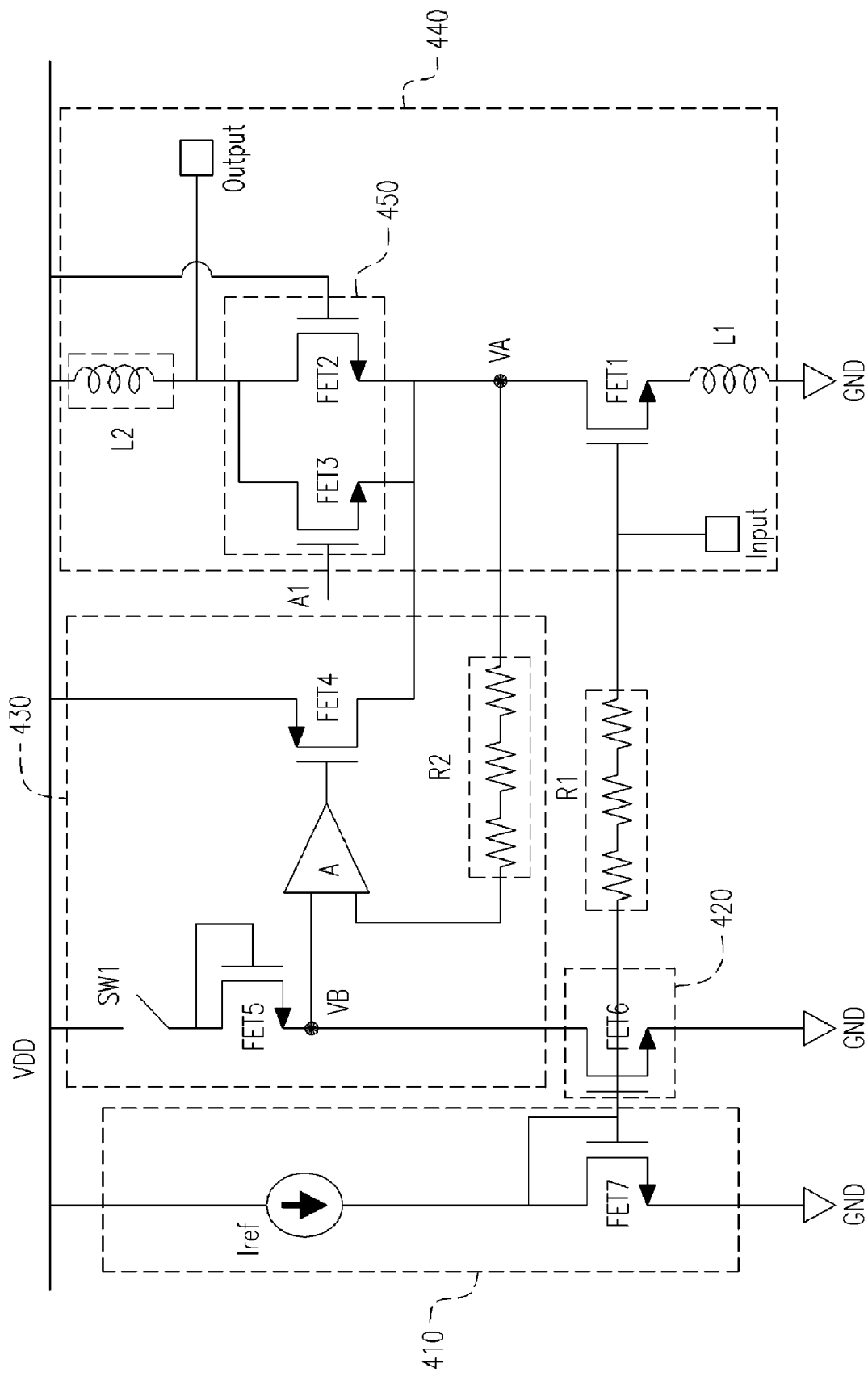
FIG. 3 to FIG. 6 are schematic drawings of the current-matching variable gain amplifier according to various embodiments of the present invention.

FIG. 3 is a schematic drawing of a current-matching variable gain amplifier according to an embodiment of the present invention. The amplifier shown in FIG. 3 comprises a reference current source 410, a cascode amplifier 440, a matching circuit 430, a control circuit 420 and a blocking circuit R1.

The function of the reference current source 410 is to supply a reference current by the current source Iref, which is equal to the left side of the current mirror.

In according to the reference current of the reference current source 410, the cascode amplifier 440 receives an input signal from an input terminal, amplifies and further outputs the signal at an output terminal as an output signal. Although the illustrated embodiment in FIG. 3 is a single-sided cascode amplifier with only one cascode amplifier 440, the present invention is not limited to only one cascode simplifier. In other embodiments, two or more cascode amplifiers can be included.

The cascode amplifier 440 comprises an inductor L1, a NMOS transistor FET1, a transistor module 450 and a load circuit L2. The details are described as follows.

The inductor L1 is coupled between a ground GND and the NMOS transistor FET1, for matching the input impedance. The NMOS transistor FET1 is coupled among the inductor L1, the input terminal and a node VA, for receiving the input signal from the input terminal, and mirroring the reference current from the NMOS transistor FET7 of the reference current source 410.

The transistor module 450 is coupled among the node VA, a voltage source VDD and the output terminal. The transistor module 450 in the embodiment comprises parallel-connected main MOS transistor FET2 and the secondary MOS transistor FET3. Wherein, the secondary MOS transistor FET3 with a smaller size is used for maintaining the linearity of the amplifier at a low current state, and can be turned on or turned off according to the control signal A1. FET2 and FET3 in the embodiment are all the NMOS transistors, and the present invention also includes PMOS transistor (p-channel metal oxide semiconductor field transistor, or PMOSFET). The function of the transistor module 450 will be detailed in the following. Though the embodiment of the present invention in FIG. 3 includes only one secondary MOS transistor FET3, the present invention can include any number of secondary MOS transistors, or no secondary MOS transistor.

The load circuit L2, as an output load, is coupled between the voltage source VDD and the output terminal of the cascode amplifier 440, to receive the current from the voltage source VDD. Although the load circuit L2 in the embodiment of the present invention comprises only one inductor, the load circuit L2 in the field of the present invention can comprise any number of load devices, such as a circuit composed of capacitor, inductor and resistor.

As shown in FIG. 3, the matching circuit 430 comprises a switching device SW1, a NMOS transistor FET5, an operational amplifier A, a PMOS transistor FET4, and a blocking circuit R2. Wherein the switching device SW1 is coupled between the voltage source VDD and the NMOS transistor FET5, to control whether the current passes through the NMOS transistor FET5. The NMOS transistor FET5 is diode-connected, and is coupled between the switch device SW1 and a node VB. The first input terminal of the operational amplifier A is coupled to the node VB, the second input terminal is coupled to the blocking circuit R2, and the output terminal is coupled to the PMOS transistor FET4. The PMOS transistor FET4 is coupled among the voltage source VDD, the output terminal of the operational amplifier A and the node VA of the cascode amplifier 440. The blocking circuit R2 is coupled between the second input terminal of the operational amplifier A and the node VA, for blocking radio frequency signal.

The switching device SW1 in the embodiment of the present invention can be implemented by a MOS transistor. Further, in the field of the present invention, the blocking circuit R1 and R2 can comprise at least a high impedance device, such as a resistor or an inductor for blocking radio frequency signal. The blocking circuit R1 and R2 in the embodiment of the present invention comprise three resistors connected in serial. The function of the matching circuit 430 will be described in the following.

The control circuit 420 in FIG. 3 is coupled to the matching circuit 430, for controlling the current passing through the NMOS transistor FET5. The control circuit 420 in the embodiment of the present invention comprises only one NMOS transistor FET6. FET6 and the NMOS transistor FET7 of the reference current source 410 constitute a current mirror, to mirror the reference current to FET6 and FET5. The control circuit in the present invention is not as simple as the control circuit 420, more complex control circuit will be presented in other embodiments. Also, how the control circuit controls the current of the NMOS transistor FET5 will be described.

The blocking circuit R1 is coupled between the NMOS transistor FET7 of the reference current source 410 and the input terminal of the cascode amplifier 440, for blocking radio frequency signal. In the field of the present invention, the blocking circuit R1 comprises at least a high impedance device. The blocking circuit R1 in the embodiment of the present invention comprises three resistors connected in serial.

The current-matching variable amplifier in FIG. 3 has two gains available for switching. At the high gain mode, the switching device SW1 is turned off so that the matching circuit 430 is disabled, and the NMOS transistor FET3 is turned on by the control signal A1. Further, the NMOS transistor FET2 and FET3 are turned on at the same time and the cascode amplifier 440 operates in a normal condition to achieve a high gain.

At the low gain mode, the NMOS transistor FET3 is turned off by the control signal A1, and the switching device SW1 is turned on. The matching circuit 430 comprises a feedback control mechanism with the operational amplifier A serving as a center. The feedback mechanism will activate when the switching device SW1 is turned on. In the meantime, the NMOS transistor FET6 and FET7 constitute the current mirror to mirror the reference current of the FET7 to the FET6 and the FET5. The FET5, which is diode-connected, can provide the reference voltage at the node VB to the operational amplifier A, and the blocking circuit R2 can transmit the voltage at the node VA to the operational amplifier A. After the operational amplifier A compares the voltages of two nodes, the output of the operational amplifier A can control the gate of the PMOS transistor FET4, so that the FET4 generate a current. The current of the FET4 can decrease the current passing through the FET2, which further decreases the gate-to-source voltage of the FET2, or decrease the voltage of the node VA. Then, the voltage at the node VA can consequently affect the output of the operational amplifier A.

The matching circuit 430, through the above-mentioned feedback mechanism, can make the voltages at the node VA and the node VB equal. Further, the size of the NMOS transistor FET5 and FET2 is completely identical, and the gate-to-source voltages are the same. Thus, the FET2 and the FET5 also constitute a current mirror, so the current passing through the FET2 is equal to the current passing through the FET5. The current-matching variable gain amplifier in FIG. 3 switches the gains according to the current change of FET2 in response to the FET5.

Figure 4:
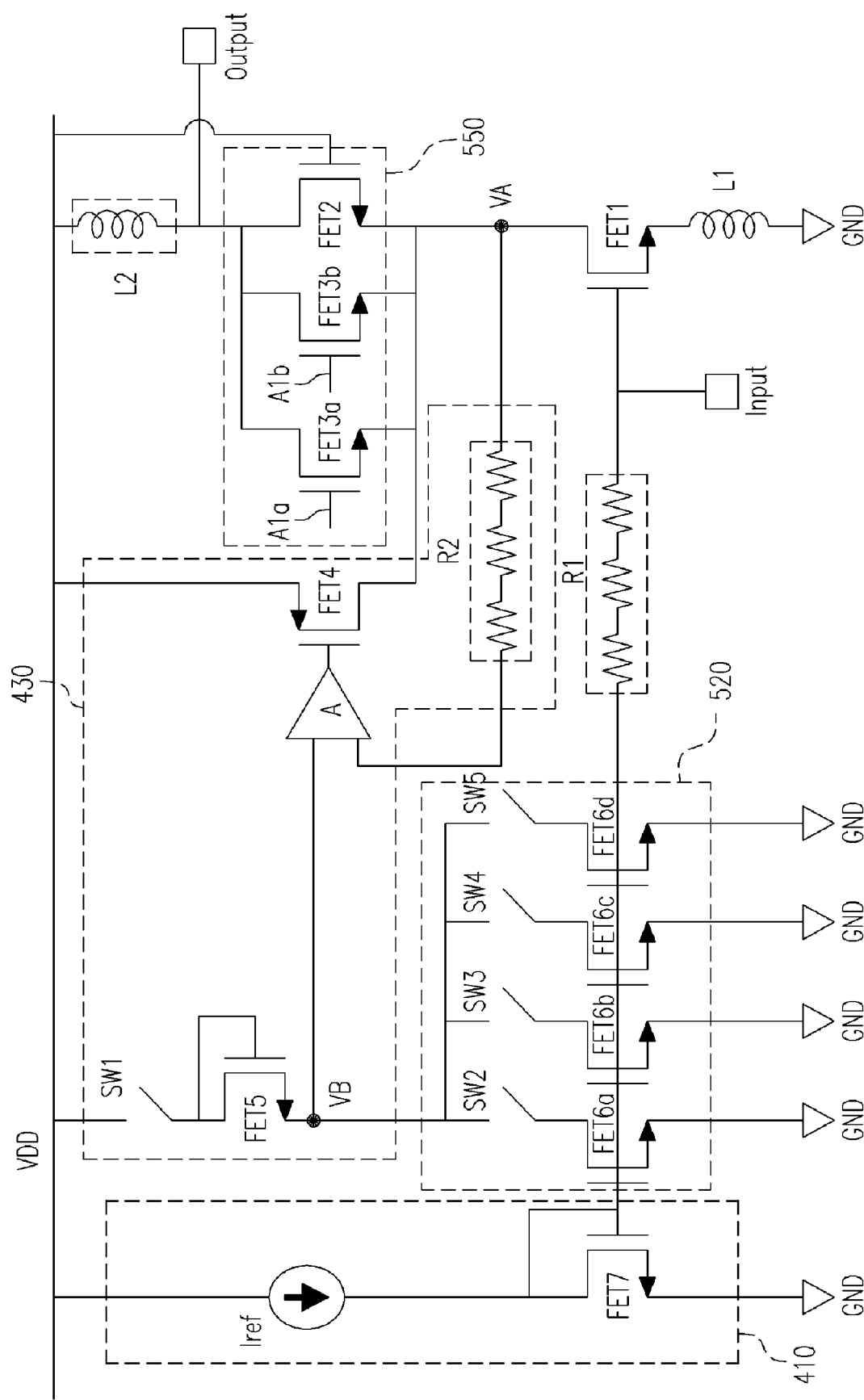

FIG. 4 is a schematic drawing of a current-matching variable gain amplifier according to another embodiment of the present invention. FIG. 4 is obtained by extending the two-stage gains of the amplifier in FIG. 3 to multi-stage gains. The control circuit 420 in FIG. 3 is replaced with a control circuit 520 in FIG. 4, and the transistor module 450 in FIG. 3 is replaced with a transistor module 550 in FIG. 4. The other devices in FIG. 4 are the same as those in FIG. 3.

The control circuit 520 in FIG. 4 comprises four branches, and each branch is separately coupled among the matching circuit 430, the reference current source 410 and the ground GND. Each branch separately comprises a switching device (SW2 to SW5) connected in series, and a NMOS transistor (FET6a to FET6d). The NMOS transistors FET6a to FET6d, with the NMOS transistor FET7, separately constitute a current mirror to mirror the reference current to each branch, and the switching devices SW2 to SW5 control whether each branch is turned on. From FIG. 4, it can be seen that the current passing through the NMOS transistor FET5 is the total current passing through all the branches, therefore, through combination of turning on and turning off among the switching devices SW2 to SW5, the current passing through the NMOS transistor FET5 can be controlled, and the gain of the current-matching variable gain amplifier in FIG. 4 can be changed.

Although the control circuit 520 in FIG. 4 comprises four branches, the present invention is not limited thereto. In the field of the present invention, the control circuit can comprise any number of branches which comprise a corresponding number of MOS transistors and switching devices.

The transistor module 550 in FIG. 4 comprises a main MOS transistor FET2 and secondary MOS transistors FET3a and FET3b. The three MOS transistors are parallel connected between the output terminal and the node VA. Wherein, the secondary MOS transistor FET3a and FET3b are turned on or turned off according to the control signal A1a or A1b, respectively. The functions of the FET3a and FET3b are the same as the secondary MOS transistor FET3 in FIG. 3.

In the current-matching variable gain amplifier in FIG. 4, at the highest gainmode, all the switching devices SW1 to SW5 are turned off, whereas all the secondary MOS transistors FET3a and FET3b are turned on by the control signals A1a and A1b. If a lower gain is desired, the switching devices SW1 and SW2 to SW5 can be turned on individually, and the matching circuit 430 is activated, so that the PMOS transistor FET4 generates a current. In the meantime, the secondary MOS transistor FET3a and FET3b can be sequentially turned off, for decreasing the size of the transistor in the transistor module 550 and maintaining the operation of the turned-on transistor in the saturation region. Since the current passing through the transistor module 550 is decreased, the current-matching variable gain amplifier in FIG. 4 can achieve a lower gain. At the lowest gain mode, the switching devices SW1 to SW2 are turned on, whereas the switching devices SW3 to SW5 and the secondary MOS transistor FET3a and FET3b are turned off.

Figure 5:
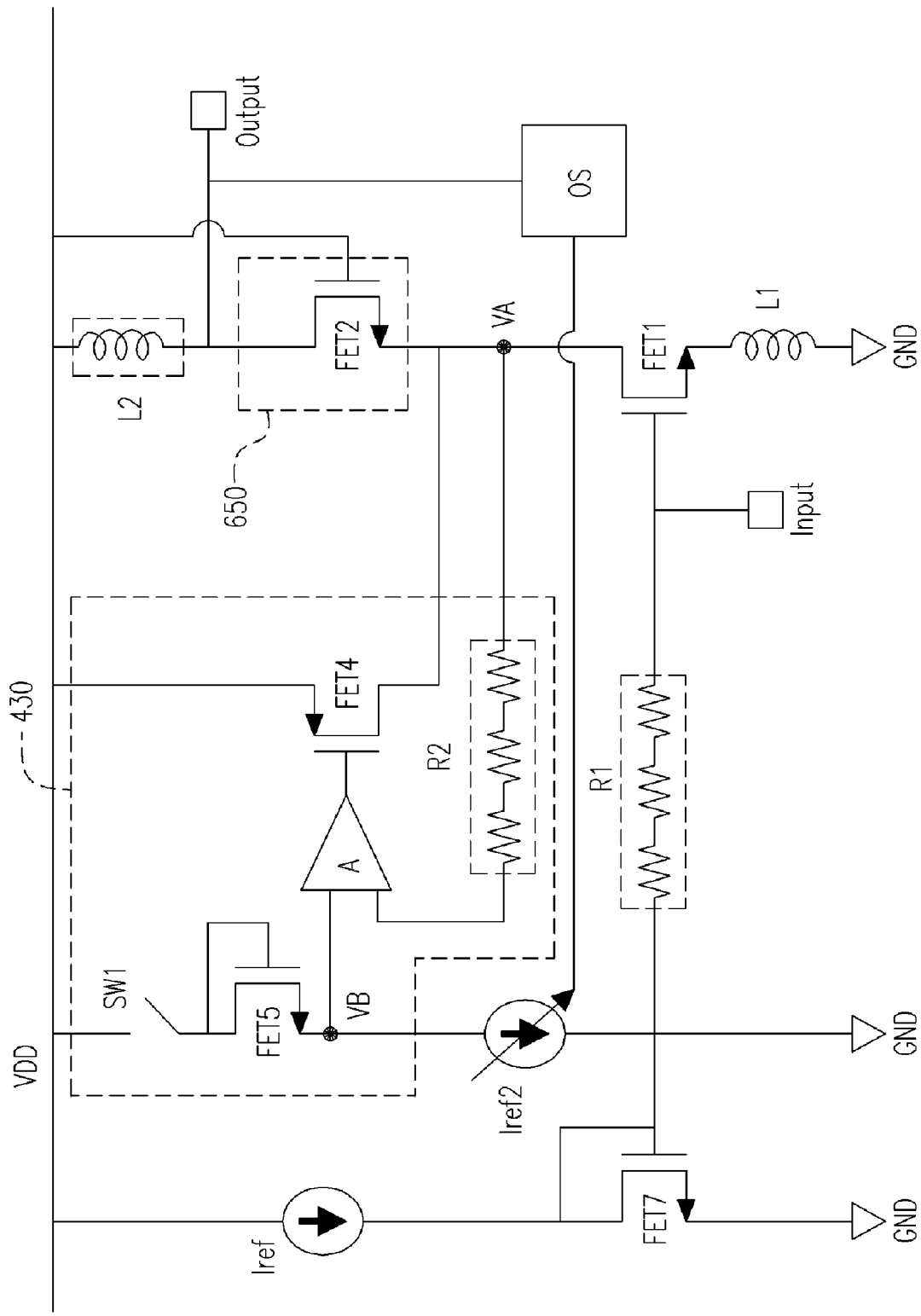

FIG. 5 is a schematic drawing of a current-matching variable gain amplifier according to another embodiment of the present invention. The main difference between FIG. 3 and FIG. 5 is that the transistor module 450 in FIG. 3 is replaced with transistor module 650 without the secondary MOS transistor, and the control circuit 420 in FIG. 3 is replaced with a variable current source Iref2 and an output sensor OS in FIG. 5. Other devices in FIG. 5 are the same as those in FIG. 3.

An object of the current-matching variable gain amplifier in FIG. 5 is to automatically modify the variation of the surrounding temperature, the variation of the voltage source VDD, and the effect of the manufacturing process on the gain of the amplifier. The output sensor OS can sense the change of the output voltage at the output terminal for adjusting the current of the variable current source Iref2. Since Iref2 is coupled to the NMOS stransistor FET5 of the matching circuit 430, the output current of Iref1 is the current passing through the NMOS transistor FET5 and FET2, and can change the gain at the output terminal. Therefore, the current-matching variable gain amplifier in FIG. 5 can automatically modify the effect of the above mention factors on the gain.

For example, table 1 shows the effect of the variation of the voltage and the temperature on the gain of the amplifier. From table 1, it can be seen that the real difference is near 1 dB. If the automatic modification in FIG. 5 is utilized, the tolerance could be minimal.

TABLE 1

Effect of variation of voltage and temperature on the gain

| | Temperature Variation | | | Temperature Variation | | |
|---|---|---|---|---|---|---|
| Change of voltage VDD | −40° C. | 25° C. | 85° C. | −40° C. | 25° C. | 85° C. |
| | Difference of high-low gain (dB) | | | Tolerance of Difference of high-low gain (dB) | | |
| 1.7 V | 14.12 | 15.21 | 15.93 | −0.9 | 0.21 | 0.93 |
| 1.8 V | 13.18 | 15.33 | 15.96 | −0.8 | 0.33 | 0.96 |
| 1.9 V | 14.18 | 15.32 | 16.00 | −0.8 | 0.32 | 0.99 |

Figure 6:
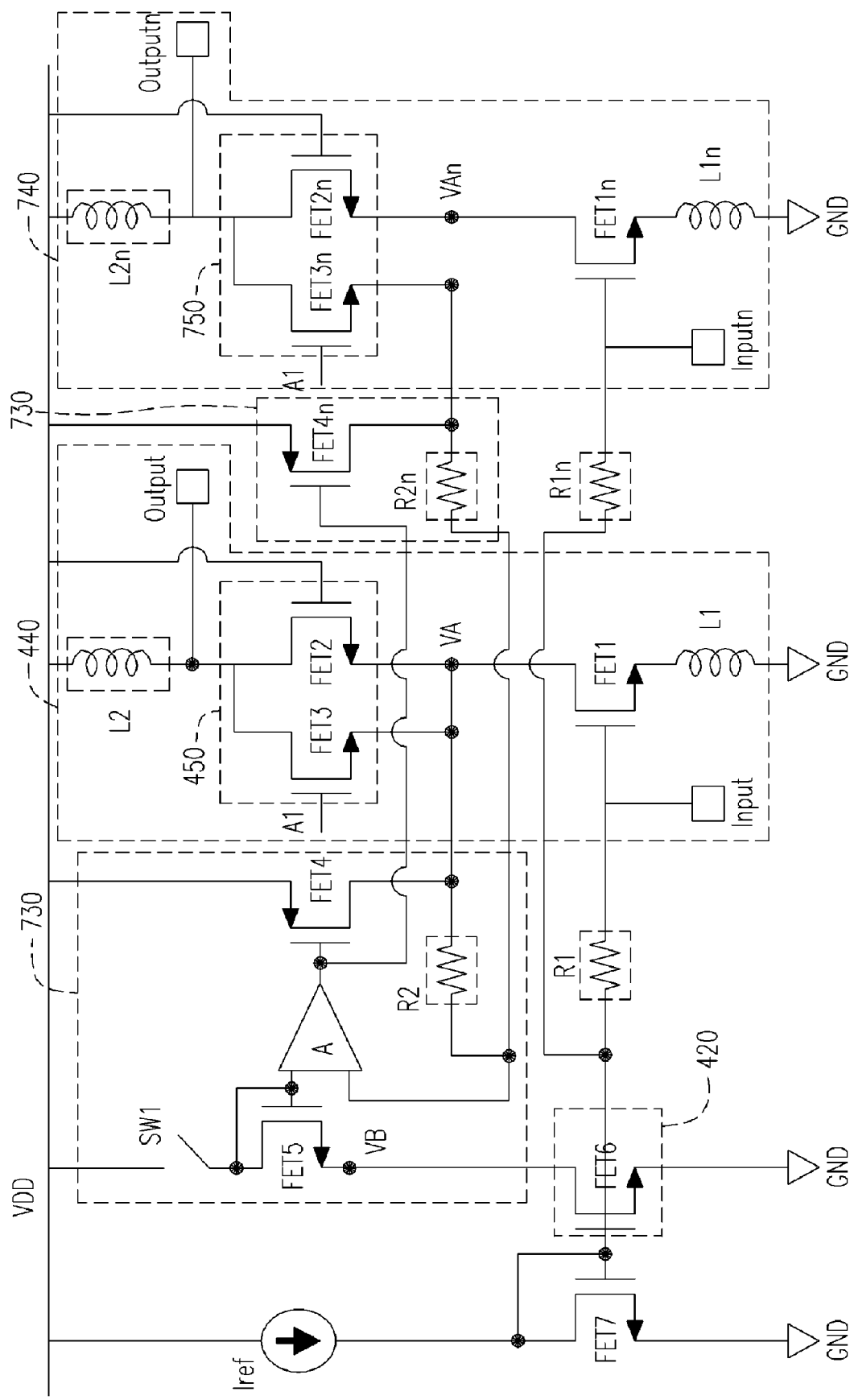

FIG. 6 is a schematic drawing of a current-matching variable gain amplifier according to another embodiment of the present invention. Except for the cascode amplifier 440, the embodiment in FIG. 6 comprises another cascode amplifier 740. The two cascode amplifiers connected in parallel constitute a differential cascode amplifier, wherein the input terminal comprises the input terminal of the cascode amplifier 440 and the input terminal of the cascode amplifier 740 connected in series, and the output terminal comprises the output terminal of the cascode amplifier 440 and the output terminal of the cascode amplifier 740 connected in series.

For the additional cascode amplifier 740, a blocking circuit R1 n is added between the NOMS transistor FET1$n$ and FET7 to block the radio frequency in the embodiment in FIG. 6. Compared with the matching circuit 430 in FIG. 3, a PMOS transistor FET4$n$ and a blocking circuit R2$n$ are added in the matching circuit 730 in FIG. 6. The PMOS transistor FET4$n$ is coupled among the output terminal of the amplifier A, the voltage source VDD, and connected in series with the node VAn of the cascode amplifier 740, and the blocking circuit R2$n$ is coupled between the second input terminal of the amplifier A and the node VAn. The matching circuit 730, by the feedback mechanism, can keep the voltages at the nodes VB, VA and Van consistent, and can keep the currents passing through the NOMS transistors FET2 and FET2$n$ the same as the current passing through the FET5. Other devices in FIG. 6 are the same as those in FIG. 3.

The control circuit 420 in FIG. 6 can be replaced by the control circuit 520 in FIG. 4. The transistor module 450 and 750 in FIG. 6 can be replaced by the transistor module 550 in FIG. 4. The control circuit 420 in FIG. 6 also can be replaced by the variable current source Iref2 and the output sensor OS. Further, though the embodiment in FIG. 6 only comprises two cascode amplifiers 440 and 740 connected in parallel, but the present invention covers the embodiments which utilize more cascode amplifiers. After reading the above-mentioned description, the modification and extension from the prevent invention should be apparent to one of ordinary skill in the art.

In summary, the present invention uses the feedback control mechanism to achieve current match. Therefore, the circuit is simpler, a complex impedance match is not required, and the size of the transistor no long matters. Furthermore, since the size of the PMOS transistor of the matching circuit, such as the PMOS transistor FET4 in FIG. 3, is smaller, the power wastage at the high gain mode would be lower. Thus, the present invention provides a solution to the conventional technical problems.

The above description provides a full and complete description of the preferred embodiments of the present invention. Various modifications, alternate construction, and equivalent may be made by those skilled in the art without changing the scope or spirit of the invention. Accordingly, the above description and illustrations should not be construed as limiting the scope of the invention which is defined by the following claims.

What is claimed is:

1. A current-matching variable gain amplifier, comprising:
    a reference current source, for providing a reference current;
    at least a cascode amplifier, receiving an input signal and outputting an output signal according to the reference current;
    a matching circuit, coupled to the cascode amplifiers, for equaling the voltage of a first node of each of the cascode amplifiers to the voltage of a second node of the matching circuit;
    a control circuit, coupled to the matching circuit, for controlling the current of a first metal oxide semiconductor field effect transistor (MOS transistor) of the matching circuit; and
    at least a first blocking circuit, each of the first blocking circuit(s) corresponding with the cascode amplifier and is coupled between the reference current source and the corresponding cascode amplifier, for blocking radio frequency signals.

2. The current-matching variable gain amplifier of claim 1, wherein the current-matching variable gain amplifier comprises only one cascode amplifier, and the cascode amplifier constitutes a single-sided cascode amplifier.

3. The current-matching variable gain amplifier of claim 1, wherein the current-matching variable gain amplifier comprises two cascode amplifiers connected in parallel, and the cascode amplifiers constitute a differential cascode amplifier, the output terminal of the differential cascode amplifier being a set of the output terminals of the cascode amplifiers, and the input terminal of the differential cascode amplifier being a set of the input terminals of the cascode amplifiers.

4. The current-matching variable gain amplifier of claim 1, wherein the size of a main MOS transistor of each cascode amplifier is identical to the size of the first MOS transistor of the matching circuit.

5. The current-matching variable gain amplifier of claim 1, wherein the matching circuit utilizes a feedback control mechanism so that the voltage of the first node of each cascode amplifier is equal to the voltage of the second node of the matching circuit and the current of a main MOS transistor of each cascode amplifier is equal to the current of the first MOS transistor of the matching circuit.

6. The current-matching variable gain amplifier of claim 5, wherein the matching circuit further comprises:
    a switch device, coupled to a voltage source;
    the first MOS transistor, diode-connected and coupled between the switch device and the second node;

an operational amplifier having an input terminal coupled to the second node;

at least a second MOS transistor, each of the second MOS transistor(s) corresponding with the cascode amplifier, and is coupled among the voltage source, the output terminal of the operational amplifier and the first node of the corresponding cascode amplifier; and at least a second blocking circuit, each of the second blocking circuit(s) corresponding with the cascode amplifier, and coupled between another input terminal of the operational amplifier and the first node of the corresponding cascode amplifier, for blocking radio frequency signals.

7. The current-matching variable gain amplifier of claim 6, wherein the switch device is a MOS transistor.

8. The current-matching variable gain amplifier of claim 6, wherein each second blocking circuit comprises at least a high impedance device.

9. The current-matching variable gain amplifier of claim 1, wherein the control circuit further comprises:

at least a third MOS transistor, coupled among the matching circuit, the reference current source and a ground, each of the third MOS transistors constituting a current mirror with the reference current source;

wherein if the control circuit comprises more than one third MOS transistor, the control circuit further comprising:

a plurality of switch devices, each of the switch devices corresponding with one of the third MOS transistors, and respectively coupled between the matching circuit and the corresponding third MOS transistor.

10. The current-matching variable gain amplifier of claim 1, wherein the control circuit further comprises:

a variable current source, coupled to the matching circuit; and an output sensor, coupled between the variable current source and the output terminals of the cascode amplifiers, for adjusting the output current of the variable current source according to the output voltages of the cascode amplifiers.

11. The current-matching variable gain amplifier of claim 1, wherein each first blocking circuit comprises at least a high impedance device.

12. The current-matching variable gain amplifier of claim 1, wherein each of the cascode amplifiers further comprises:

an inductor, coupled to a ground;

a fourth MOS transistor, coupled among the inductor, the input terminal of the cascode amplifier and the first node, for receiving the input signal;

a main MOS transistor, coupled among the first node, a voltage source and an output terminal of the cascode amplifier; and a load circuit, coupled between the voltage source and the output terminal of the cascode amplifier, for receiving a current from the voltage source.

13. The current-matching variable gain amplifier of claim 12, wherein the load circuit comprises at least a load device and the type of the load device is one of capacitor, inductor and resistor.

14. The current-matching variable gain amplifier of claim 12, further comprising:

at least a secondary MOS transistor, connected in parallel to the main MOS transistor, each secondary MOS transistor being turned on or turned off according to a corresponding control signal.

15. The current-matching variable gain amplifier of claim 1, wherein the matching circuit is also for equaling the current of a main MOS transistor of each cascode amplifier to the current of the first MOS transistor of the matching circuit.

* * * * *